(12) United States Patent
Her et al.

(10) Patent No.: US 11,331,869 B2
(45) Date of Patent: *May 17, 2022

(54) METHOD OF MANUFACTURING MOLD SUBSTRATE FOR DIFFRACTION LATTICE LIGHT GUIDE PLATE, AND METHOD OF MANUFACTURING DIFFRACTION LATTICE LIGHT GUIDE PLATE

(71) Applicant: LG CHEM, LTD., Seoul (KR)

(72) Inventors: Eun Kyu Her, Daejeon (KR); Chung Wan Kim, Daejeon (KR); Song Ho Jang, Daejeon (KR); Bu Gon Shin, Daejeon (KR); Jeong Ho Park, Daejeon (KR); Jung Hwan Yoon, Daejeon (KR); So Young Choo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 120 days.

This patent is subject to a terminal disclaimer.

(21) Appl. No.: 16/635,457

(22) PCT Filed: Aug. 16, 2018

(86) PCT No.: PCT/KR2018/009398
§ 371 (c)(1),
(2) Date: Jan. 30, 2020

(87) PCT Pub. No.: WO2019/035661
PCT Pub. Date: Feb. 21, 2019

(65) Prior Publication Data
US 2020/0368981 A1    Nov. 26, 2020

(30) Foreign Application Priority Data

Aug. 16, 2017 (KR) .................. 10-2017-0103662

(51) Int. Cl.
*B29D 11/00* (2006.01)
*B29C 33/38* (2006.01)
(Continued)

(52) U.S. Cl.
CPC .... *B29D 11/00663* (2013.01); *B29C 33/3842* (2013.01); *B29D 11/0073* (2013.01);
(Continued)

(58) Field of Classification Search
CPC .......... H01J 37/32467; H01J 37/32449; H01J 37/3244; H01J 37/32651; H01J 37/321;
(Continued)

(56) References Cited

U.S. PATENT DOCUMENTS 9,139,914 B2    9/2015  Kim et al.
9,659,797 B1    5/2017  Burckel et al.
(Continued)

FOREIGN PATENT DOCUMENTS

JP    2011-18870 A    1/2011
KR    10-0281241 B1   11/2000
(Continued)

*Primary Examiner* — Mathieu D Vargot
(74) *Attorney, Agent, or Firm* — Dentons US LLP

(57) ABSTRACT

The present invention relates to a method of manufacturing a mold substrate for a diffraction lattice light guide plate, and a method of manufacturing a diffraction lattice light guide plate.

12 Claims, 7 Drawing Sheets

(51) Int. Cl.
*H01J 37/32* (2006.01)
*B29L 11/00* (2006.01)

(52) U.S. Cl.
CPC ...... *H01J 37/321* (2013.01); *H01J 37/32651* (2013.01); *B29L 2011/0075* (2013.01); *H01J 2237/3341* (2013.01)

(58) Field of Classification Search
CPC .. G02B 6/0065; G02B 6/0038; G02B 6/0018; B29D 11/00663; B29D 11/0073; B29C 33/3842
See application file for complete search history.

(56) References Cited

U.S. PATENT DOCUMENTS

| | | | |
|---|---|---|---|
| 2010/0096088 | A1 | 4/2010 | Okita et al. |
| 2012/0273130 | A1 | 11/2012 | Drewery et al. |
| 2014/0367687 | A1 | 12/2014 | Loncar et al. |
| 2020/0203131 | A1* | 6/2020 | Her .................. C03C 23/006 |
| 2020/0335347 | A1* | 10/2020 | Her .................. B29D 11/00 |
| 2020/0365379 | A1* | 11/2020 | Her .................. H01J 37/32357 |
| 2021/0027996 | A1* | 1/2021 | Kang .................. G03F 1/80 |

FOREIGN PATENT DOCUMENTS

| | | | |
|---|---|---|---|
| KR | 10-2009-125140 A | 12/2009 | |
| KR | 10-1409387 B1 | 6/2014 | |
| KR | 10-1509529 B1 | 4/2015 | |

* cited by examiner

[FIG. 1]
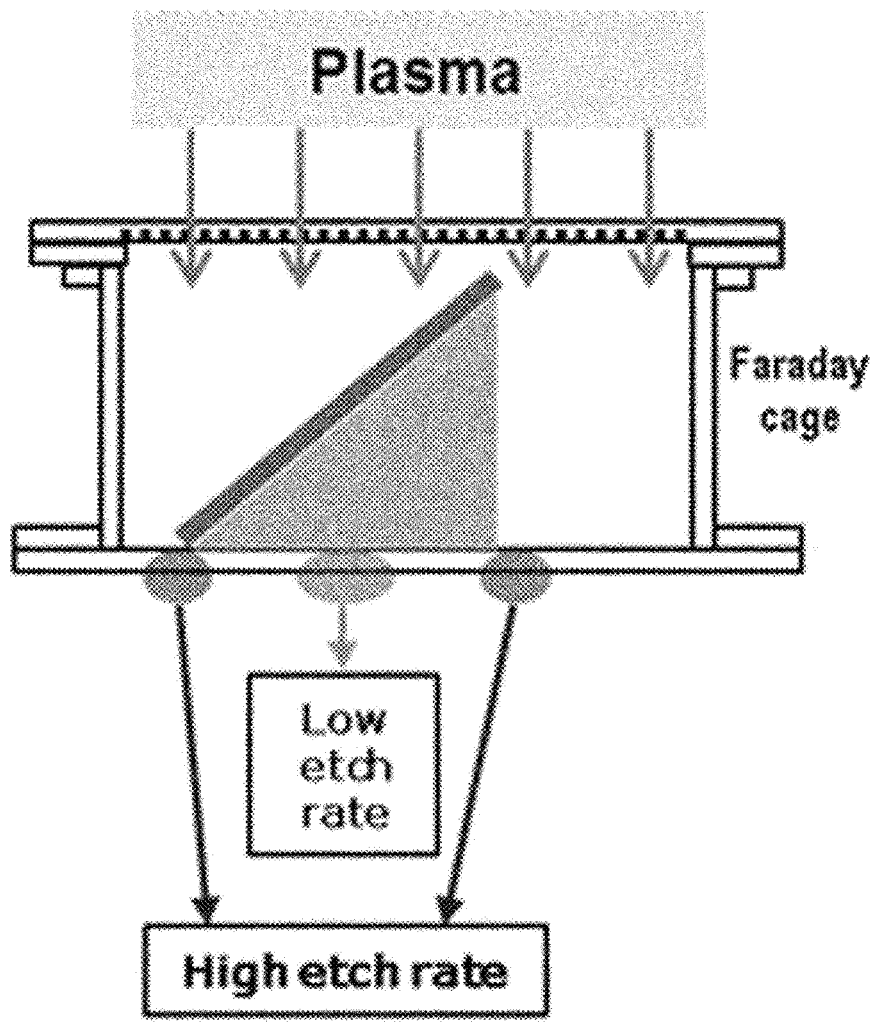

[FIG. 2]
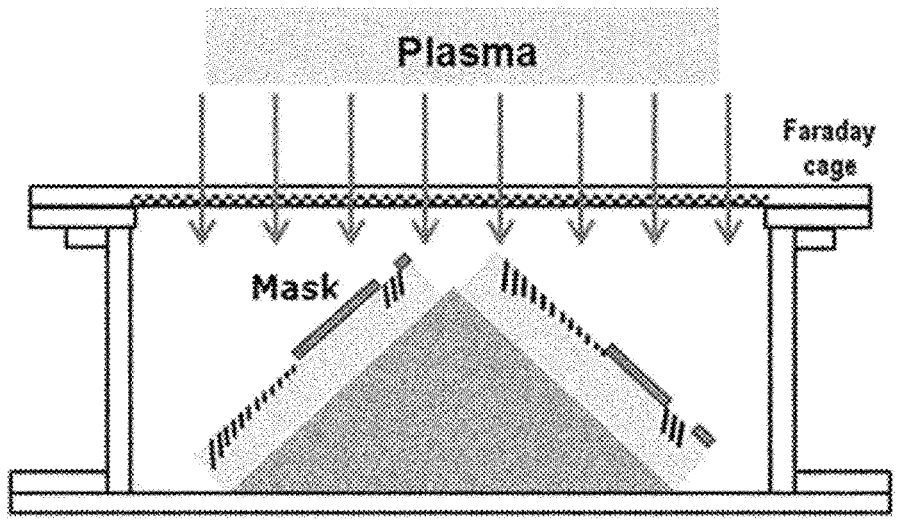
[FIG. 3]
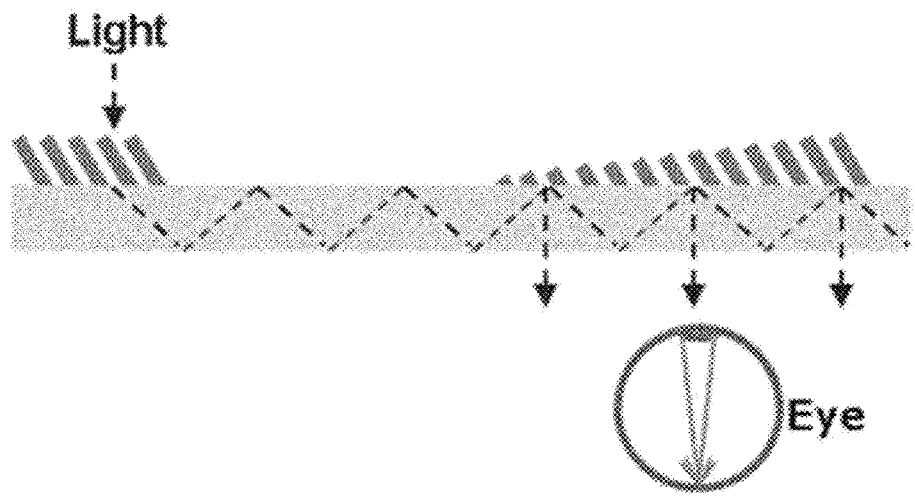

[FIG. 4]
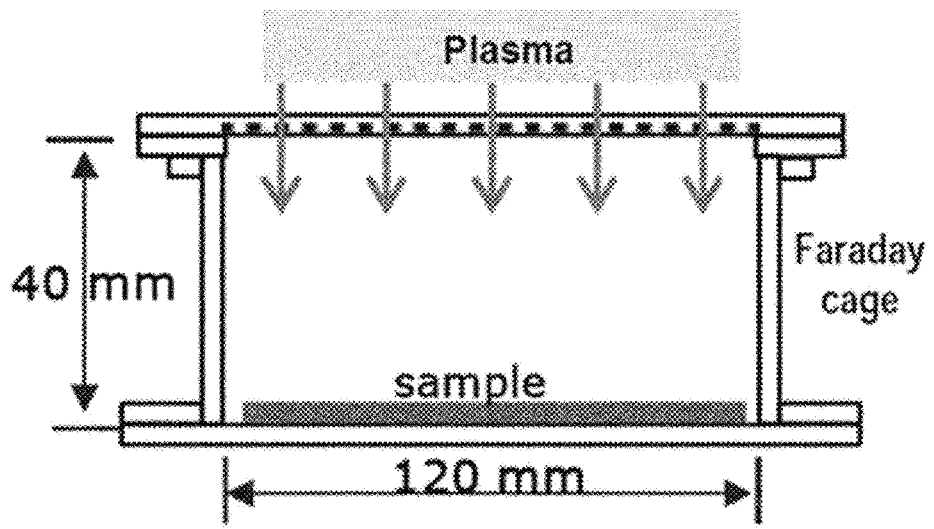
[FIG. 5]
| COMPARATIVE EXAMPLE | EXAMPLE |
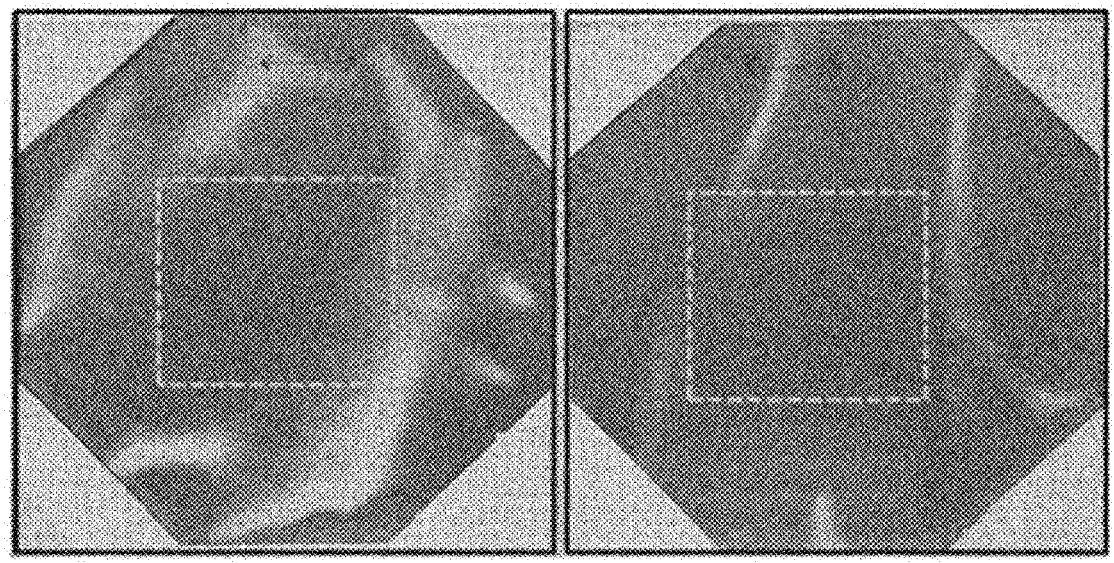

[FIG. 6]
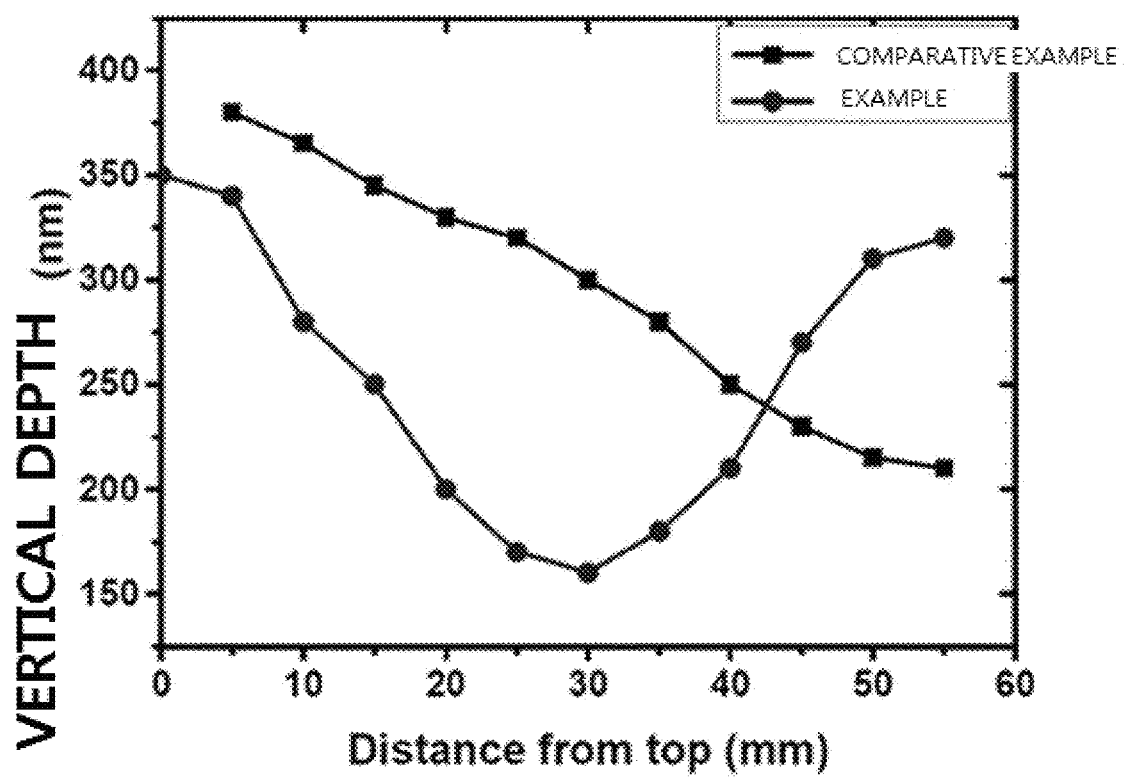

[FIG. 7a]
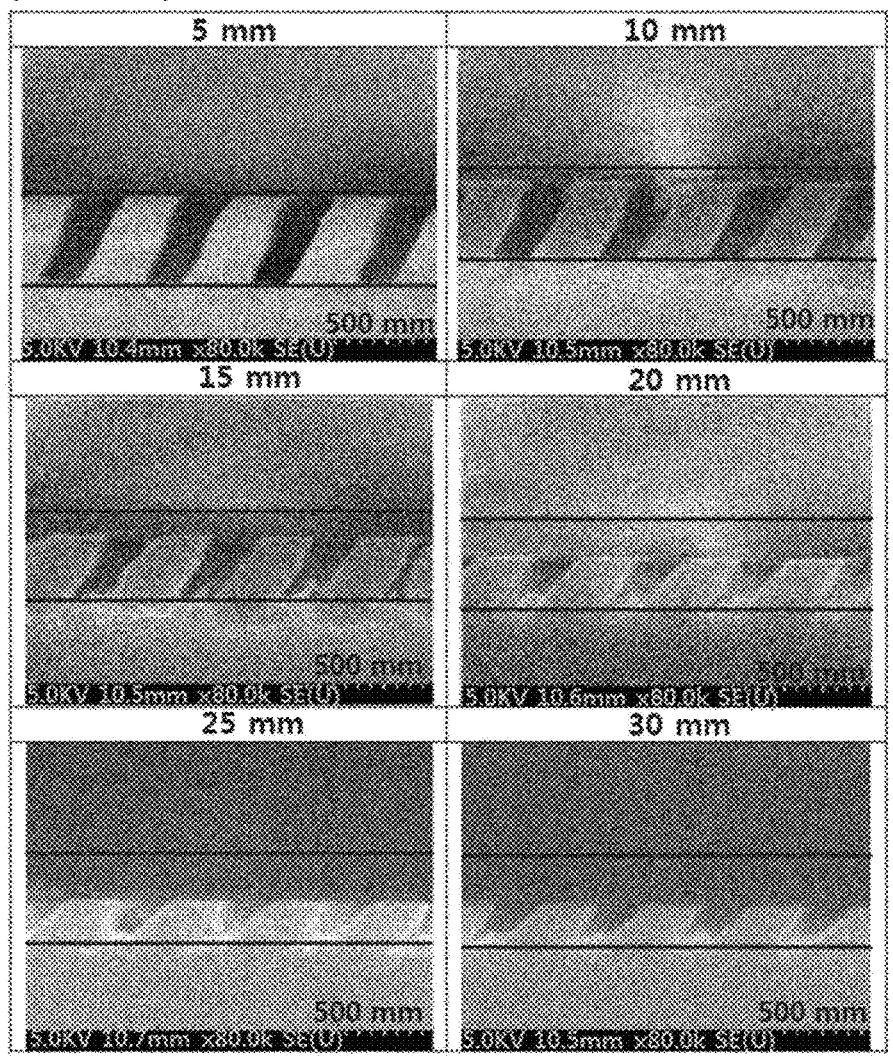

[FIG. 7b]
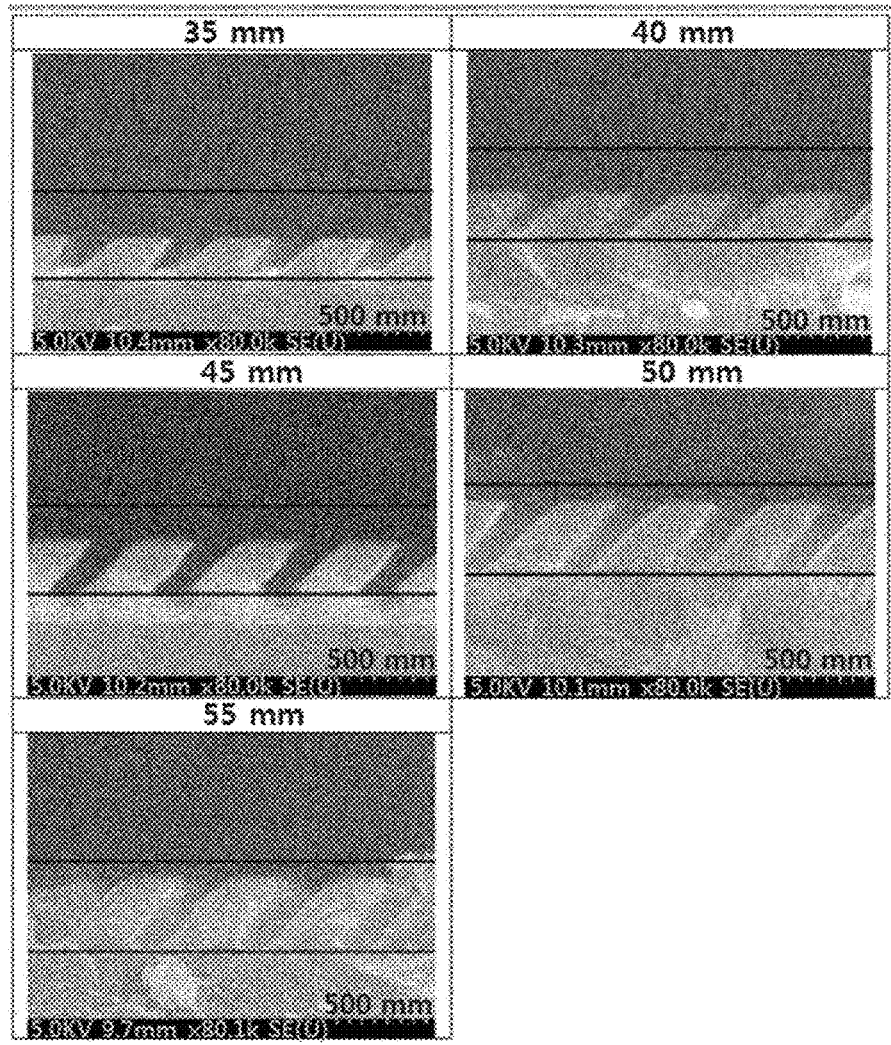

[FIG. 8]
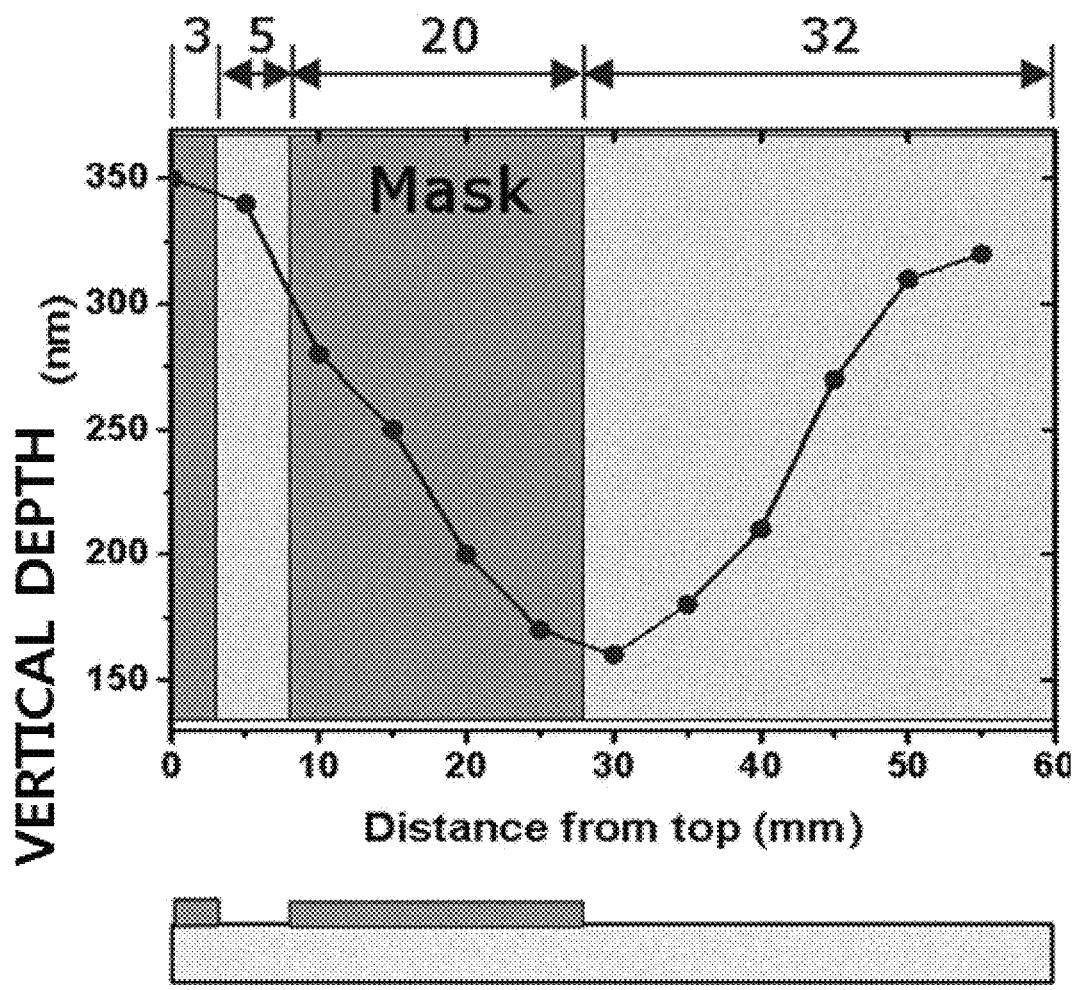

METHOD OF MANUFACTURING MOLD SUBSTRATE FOR DIFFRACTION LATTICE LIGHT GUIDE PLATE, AND METHOD OF MANUFACTURING DIFFRACTION LATTICE LIGHT GUIDE PLATE

CROSS-REFERENCE TO RELATED APPLICATIONS

This application is the U.S. national stage of international Application No. PCT/KR2018/009398 filed Aug. 16, 2018, and claims priority to and the benefit of Korean Patent Application No. 10-2017-0103662 filed in the Korean Intellectual Property Office on Aug. 16, 2017, the entire contents of which are incorporated herein by reference.

TECHNICAL FIELD

The present invention relates to a method of manufacturing a mold substrate for a diffraction lattice light guide plate, and a method of manufacturing a diffraction lattice light guide plate.

BACKGROUND

In order to display a desired image to a user on a display, a light guide plate for changing a state of visible light may be used. A light guide plate may interact with visible light incident through reflection, refraction, diffraction, or the like, and a desired image may be displayed to a user by adjusting the interaction. The light incident to the light guide plate may interact with a structure provided in the light guide plate to be diffracted, and the diffraction results from wave nature of light and may be expressed by interference of light waves. When the light incident into the light guide plate meets a periodical structure, the light may be divided into beams in different directions by the diffraction of the light and viewed to a user.

In order to display a desired image to a user through a display without distortion, there is a need for research for a method of forming a fine structure of a light guide plate so that light incident to a light guide plate is output on a display with a uniform intensity.

Related Patent Document:Korean Patent No. KR 10-1131101 B1

SUMMARY

An object of the present invention is to provide a method of manufacturing a mold substrate for a diffraction lattice light guide plate, and a method of manufacturing a diffraction lattice light guide plate.

An object to be solved in the present invention is not limited to the aforementioned objects, and other objects not-mentioned herein will be clearly understood by those skilled in the art from descriptions below.

An exemplary embodiment of the present invention provides a method of manufacturing a mold substrate for a diffraction lattice light guide plate, the method comprising: preparing a faraday cage with a mesh portion having sheet resistance of 0.5 Ω/sq or more provided on an upper surface thereof; checking a high etching region within the faraday cage throughout providing a sample substrate on a bottom surface of the faraday cage and carrying out flat plasma etching; preparing a support having an inclined surface and positioning a lower region of the inclined surface to the high etching region of the faraday cage to align the support; providing a substrate for a mold on the inclined surface of the support; and performing patterning, in which a first inclined pattern portion is formed at one side of the substrate for the mold and a second inclined pattern portion is formed at the other side of the substrate for the mold by using plasma etching at the same time, wherein an etch rate of the patterning decreases and reversely increases from an upper region to the lower region of the inclined surface, the first inclined pattern portion includes an inclined recess pattern having a depth gradient, and the second inclined pattern portion includes an inclined recess pattern having a depth difference of 0 nm to 50 nm. Another exemplary embodiment of the present invention provides a method of manufacturing a diffraction lattice light guide plate, the method comprising: preparing a mold substrate for a diffraction lattice light guide plate manufactured by the method of manufacturing the mold substrate for the diffraction lattice light guide plate; applying a resin composition on the mold substrate for the diffraction lattice light guide plate; providing a transparent substrate on a surface opposite surface to a surface provided with a diffraction lattice pattern; forming a diffraction lattice pattern by hardening the resin composition; and separating the mold substrate for the diffraction lattice light guide plate and the diffraction pattern and forming a diffraction lattice light guide plate.

According to the manufacturing method according to the exemplary embodiment of the present invention, there is an advantage in that it is possible to simultaneously form different inclined pattern portions on a substrate through one etching process.

According to the manufacturing method according to the exemplary embodiment of the present invention, there is an advantage in that it is possible to simultaneously form two sheets of mold substrates for a diffraction lattice light guide plate with one etching process.

According to the manufacturing method according to the exemplary embodiment of the present invention, there is an advantage in that it is possible to form a mold substrate for a diffraction lattice light guide plate having excellent accuracy with a simple process.

According to the manufacturing method according to the exemplary embodiment of the present invention, there is an advantage in that it is possible to form an inclined pattern on a substrate with a uniform inclination and adjust the inclined pattern to have a depth gradient.

BRIEF DESCRIPTION OF DRAWINGS

FIG. 1 is a schematic illustration of a method of manufacturing a mold substrate for a diffraction lattice light guide plate according to an exemplary embodiment of the present invention.

FIG. 2 is a schematic illustration of a method of manufacturing a mold substrate for a diffraction lattice light guide plate according to an exemplary embodiment of the present invention.

FIG. 3 is an exemplary illustration of a diffraction lattice light guide plate manufactured according to the manufacturing method according to the exemplary embodiment of the present invention.

FIG. 4 is a schematic illustration of an operation of checking high etching areas of faraday cages according to the Example and the Comparative Example.

FIG. 5 is an illustration of high etching areas of faraday cages according to the Comparative Example and the Example.

FIG. 6 is an illustration of etch depths in a location-based vertical direction during taper etching inside the faraday cages according to the Example and the Comparative Example.

FIGS. 7A and 7B are scanning electron microscope (SEM) images of a taper etching result based on a location according to the Example.

FIG. 8 is an exemplary illustration showing the formation of a first inclined pattern portion and a second inclined pattern portion by using a mask during the taper etching according to the Example.

DETAILED DESCRIPTION

Throughout the specification of the present application, when an element is referred to as being "on" another element, this includes the case where the element is in contact with another element, and the case where another element is present between the two elements.

Throughout the specification of the present application, unless explicitly described to the contrary, the word "comprise" will be understood to imply the inclusion of stated elements but not the exclusion of any other elements.

The term, "an operation (of)~" or "an operation of ~" used throughout the specification of the present application does not mean "an operation for ~".

In the present invention, a faraday cage means a sealed space formed of a conductor, and when a faraday cage is installed within plasma, a sheath is formed on an exterior surface of the box, so that an interior side of the box is maintained with a uniform electric field state. In this case, when an upper surface of the faraday cage is formed of a mesh portion, the sheath is formed along a surface of the mesh portion. Accordingly, when plasma etching is performed by using the faraday cage, ions accelerated in a direction vertical to the sheath horizontally formed on the surface of the mesh portion enter into the faraday cage, and then reach up to a substrate while maintaining the directionality at the time of the entrance to etch the substrate. Further, in the present invention, a surface of the substrate inside the faraday cage is fixed in a state inclined with respect to the mesh surface, and the ions enter the direction vertical to the mesh surface, so that the etching is possible in the direction inclined with respect to the surface of the substrate. Particularly, a faraday cage according to an exemplary embodiment of the present invention may be a conductor box, of which an upper surface is formed of a mesh portion having conductivity. Further, according to the exemplary embodiment of the present invention, an etch direction of the plasma etching may be a direction vertical to a surface of a mesh portion of the faraday cage.

In the case of plasma etching using a faraday cage, ions passing through the mesh portion collide with neutral particles existing inside the faraday cage while moving toward a substrate to lose kinetic energy, and thus, a density of ions tends to be in inverse proportion to a distance of the mesh portion. That is, the faraday cage represents a high etch speed as being closer to the mesh portion, into which the ions are incident, and represents a low etch speed as being farther from the mesh portion. When a diameter of a substrate is increased or a distance between the mesh portion and a lower end of the substrate is excessively large during taper etching, the existing plasma etching using the faraday cage is inevitably limitedly used due to a problem in etching uniformity. Particularly, in the case of the existing plasma etching using the faraday cage, a high etching region and a low etching region are irregularly mixed based on a location of the faraday cage, so that it is difficult to increase accuracy of the etching, and when a progress distance of the ions is long, there is a limit, such as an ion beam dispersion effect, in which a diameter of an ion beam is increased.

As a result of the continuous research on plasma etching using a faraday cage, the present inventors found that when sheet resistance of a mesh portion of a faraday cage is increased to a predetermined level or more, an etch speed of the faraday cage tends to be uniform, so that it is possible to solve an existing problem in that an etch speed is irregular based on a location. By using the result, the present inventors conceived the invention described below.

Hereinafter, the present specification will be described in more detail.

An exemplary embodiment of the present invention provides a method of manufacturing a mold substrate for a diffraction lattice light guide plate, the method comprising: preparing a faraday cage with a mesh portion having sheet resistance of 0.5 Ω/sq or more provided on an upper surface thereof; checking a high etching region within the faraday cage throughout providing a sample substrate on a bottom surface of the faraday cage and carrying out flat plasma etching; preparing a support having an inclined surface and positioning a lower region of the inclined surface to the high etching region of the faraday cage to align the support; providing a substrate for a mold on the inclined surface of the support; and performing patterning, in which a first inclined pattern portion is formed at one side of the substrate for the mold and a second inclined pattern portion is formed at the other side of the substrate for the mold by using plasma etching at the same time, wherein an etch rate of the patterning decreases and reversely increases from an upper region to the lower region of the inclined surface, the first inclined pattern portion includes an inclined recess pattern having a depth gradient, and the second inclined pattern portion includes an inclined recess pattern having a depth difference of 0 nm to 50 nm.

The mesh portion may draw a free electron in a contact surface with plasma to form a sheath during the plasma etching. Further, the mesh portion may have conductivity, and thus may draw an ion having a positive charge and accelerate the ion. Further, the mesh portion may be provided to be flat on one surface of the faraday cage, and when the mesh portion has a bent portion, an etch speed in the bent portion may be locally changed.

According to the exemplary embodiment of the present invention, the present invention includes an operation of preparing a faraday cage with a mesh portion having sheet resistance of 0.5 Ω/sq or more provided on an upper surface thereof. Particularly, according to the exemplary embodiment of the present invention, the sheet resistance of the mesh portion may be 0.5 Ω/sq or more and 100 Ω/sq or less.

When the sheet resistance of the mesh portion is 0.5 Ω/sq or more, a high etching region and a low etching region within the faraday cage may be uniformly formed at the time of the plasma etching. In the meantime, when the sheet resistance of the mesh portion is less than 0.5 Ω/sq, an etch speed is irregularly formed based on a location of the faraday cage at the time of the plasma etching, so that there is a problem in that it is difficult to precisely perform the etching. Further, when the sheet resistance of the mesh portion is more than 100 Ω/sq, an increase in efficiency of a plasma etching process is little, and only manufacturing cost is increased.

According to the exemplary embodiment of the present invention, the mesh portion is a metal mesh onto which fluorocarbon radical is adsorbed. Particularly, the fluorocarbon radical may be —CF, —CF$_2$, —CF$_3$, or —C$_2$F$_x$ (x is an integer of 1 to 5). Particularly, in the mesh portion of the faraday cage, the fluorocarbon radical may be adsorbed to the mesh portion by etching and surface polymerization by F radical at the time of the plasma etching.

According to the exemplary embodiment of the present invention, the fluorocarbon radical is adsorbed to a material, such as metal, having conductivity, so that the mesh portion may have the sheet resistance.

According to the exemplary embodiment of the present invention, the mesh portion may use a mesh formed of a stainless material. Particularly, #200 (a pitch of 125 μm, a wire diameter of 50 μm, and an aperture ratio of 36%) commercial mesh of a material of SUS 304 may be used. However, the material of the mesh portion is not limited, and the mesh portion may use Al, Cu, W, Ni, Fe, and an alloy including at least two kinds thereof as a material. Further, porosity and a lattice size of the mesh may be freely adjusted according to a usage of etching.

According to the exemplary embodiment of the present invention, the present invention includes an operation of checking a high etching region within the faraday cage throughout providing a sample substrate on a bottom surface of the faraday cage and carrying out flat plasma etching.

The checking of the high etching region within the faraday cage may include providing a sample substrate on a bottom surface of the faraday cage, carrying out flat etching by using plasma etching, examining the etched sample substrate, and checking a distribution of a high etching region and a low etching region within the faraday cage.

As described above, the faraday cage according to the present invention includes the mesh portion having sheet resistance of 0.5 Ω/sq or more, so that the high etching region and the low etching region may be uniformly formed within the faraday cage, and the uniformly formed high etching region may be checked through the operation of checking the high etching region within the faraday cage.

According to the exemplary embodiment of the present invention, the high etching region may be linearly represented on the sample substrate. The high etching region may be represented as a straight or curve region having a small width with respect to a lower surface of the faraday cage.

Accordingly, according to the exemplary embodiment of the present invention, the high etching region may be linearly represented with respect to the lower surface of the faraday cage, so that it may be easy to dispose the substrate for the mold in the high etching region. Accordingly, it is possible to more precisely form an inclined pattern portion having a depth gradient on the substrate for the mold.

According to the exemplary embodiment of the present invention, after the operation of checking the high etching region within the faraday cage, the sample substrate may be removed from the faraday cage. As long as an etch speed based on a region may be checked at the time of the plasma etching, the substrate for the sample may be used without a limit.

According to the exemplary embodiment of the present invention, the present invention includes an operation of preparing a support having an inclined surface and positioning a lower region of the inclined surface in the high etching region of the faraday cage to align the support.

According to the exemplary embodiment of the present invention, when the lower region of the inclined surface of the support is positioned in the high etching region, an etch rate in a patterning operation below tends to decrease and then reversely increase from an upper region to the lower region of the inclined surface. Particularly, the upper region of the inclined surface of the support closely positioned to the mesh portion of the faraday cage represents a high etch rate, and the etch rate is gradually decreased toward the lower region. In addition, the lower region of the support is positioned in the high etching region, so that the etch rate tends to be reversed and gradually increased.

According to the exemplary embodiment of the present invention, the present invention includes an operation of providing a substrate for a mold on the inclined surface of the support. The substrate for the mold is provided on the inclined surface of the support, so that the substrate may be a target of the etching using the foregoing tendency of the etch rate.

According to the exemplary embodiment of the present invention, the substrate for the mold may be a glass or silicon wafer. However, the kind of the substrate for the mold is not limited, and the substrate for the mold may be appropriately selected according to the kind of reactive gas applicable to a plasma etching device and a resin hardening scheme used when a diffraction lattice light guide plate is manufactured. For example, when a resin used when a diffraction lattice light guide plate is manufactured is a photo-curable resin, the substrate for the mold having high optical transmittance may be used.

According to the exemplary embodiment of the present invention, the present invention includes an operation of performing patterning, in which a first inclined pattern portion is formed at one side of the substrate for the mold and a second inclined pattern portion is formed at the other side of the substrate for the mold by using plasma etching at the same time.

The first inclined pattern portion may be provided on one surface of the substrate for the mold provided at the upper side of the inclined surface and the second inclined pattern portion may be provided on one surface of the substrate for the mold provided at the lower side of the inclined surface. Further, the first inclined pattern portion may be provided on one surface of the substrate for the mold provided at the lower side of the inclined surface and the second inclined pattern portion may be provided on one surface of the substrate for the mold provided at the upper side of the inclined surface.

According to the exemplary embodiment of the present invention, the plasma etching may be performed by using the Inductively Coupled Plasma Reactive-ion Etching (ICP-RIE) system. Particularly, the patterning may be performed by providing the faraday cage inside the ICP-RIE system. Further, the plasma etching may adopt a helicon plasma scheme, a helical resonance plasma scheme, an electron resonance plasma scheme. As described above, the etch rate of the patterning operation may decrease and then reversely increase from the upper region to the lower region of the inclined surface.

According to the exemplary embodiment of the present invention, an etch direction in the patterning operation may be perpendicular to the lower surface of the faraday cage. The etch direction in the patterning operation is the direction vertical to the lower surface of the faraday cage, so that the first inclined pattern portion and the second inclined pattern portion may be formed on one surface of the substrate for the mold by providing the substrate for the mold on the support having the inclined surface.

According to the exemplary embodiment of the present invention, an angle of inclination of the support may be 35° or more and 45° or less. The angles of inclination of the first inclined pattern portion and the second inclined pattern portion may be adjusted by adjusting the angle of inclination of the support.

By adjusting the angle of inclination of the support to the range, average angles of inclination of the patterns of the first inclined pattern portion and the second inclined pattern portion may be adjusted to 30° or more and 40° or less. For example, when the angle of inclination of the support is adjusted to 35°, minimum angles of inclination of the patterns of the first inclined pattern portion and the second inclined pattern portion may be adjusted to 27°, maximum angles of inclination thereof may be adjusted to 36°, and average angles of inclination may be adjusted to 33°. Further, when the angle of inclination of the support is adjusted to 40°, the minimum angles of inclination of the patterns of the first inclined pattern portion and the second inclined pattern portion may be adjusted to 32°, maximum angles of inclination thereof may be adjusted to 40°, and average angles of inclination may be adjusted to 36°.

According to the exemplary embodiment of the present invention, the tendency of the plasma etch speed within the faraday cage may be adjusted by adjusting the sheet resistance of the mesh portion of the faraday cage, and the first inclined pattern portion and the second inclined pattern portion may be manufactured through one process by adjusting a position of the support having the inclined surface.

According to the exemplary embodiment of the present invention, the present invention may further include an operation of providing a mask including an opening pattern portion on the substrate for the mold. The mask is for the purpose of forming the first inclined pattern portion and the second inclined pattern portion, and regions, in which the opening pattern portion of the mask is provided, may be regions corresponding to the first inclined pattern portion and the second inclined pattern portion.

According to the exemplary embodiment of the present invention, the first inclined pattern portion may include an inclined recess pattern having a depth gradient. Particularly, according to the exemplary embodiment of the present invention, the first inclined pattern portion may be formed in the region where the etch rate decreases or the region where the etch rate reversely increases.

According to the exemplary embodiment of the present invention, the first inclined pattern portion may include a region, in which a depth of the recess pattern is gradually increased or decreased. Particularly, when the first inclined pattern portion is formed at the upper side of the inclined surface of the support, the depth of the recess pattern may be gradually decreased toward a center region of the substrate for the mold. Further, when the first inclined pattern portion is formed at the lower side of the inclined surface of the support, the depth of the recess pattern may be gradually decreased toward a center region of the substrate for the mold.

According to the exemplary embodiment of the present invention, a difference between a minimum depth and a maximum depth of the inclined recess pattern of the first inclined pattern portion may be 100 nm or more and 200 nm or less. That is, in the manufacturing method according to the exemplary embodiment of the present invention, the inclined recess pattern having the depth gradient may be easily formed on the substrate for the mold.

According to the exemplary embodiment of the present invention, the second inclined pattern portion may include an inclined recess pattern having a depth difference of 0 nm to 50 nm. Particularly, the second inclined pattern portion is formed in a relatively narrow region, so that a depth of the recess pattern may be uniform.

According to the exemplary embodiment of the present invention, a depth of the inclined recess pattern of the second inclined pattern portion may be 70% to 130% of a maximum depth of the inclined recess pattern of the first inclined pattern portion. Particularly, the depth of the inclined recess pattern of the second inclined pattern portion may be 80% to 120% of the maximum depth of the inclined recess pattern of the first inclined pattern portion.

According to the exemplary embodiment of the present invention, a difference between an etch speed of the topmost portion of the inclined surface and an etch speed of the lowermost portion of the inclined surface may be 30% or less. Particularly, a difference between the etch speed of the topmost portion of the inclined surface and the etch speed of the lowermost portion of the inclined surface may be 20% or less.

According to the exemplary embodiment of the present invention, the etch speed in the patterning operation is represented high in the upper portion and the lower portion of the inclined surface of the support, so that the depth of the inclined recess pattern of the second inclined pattern portion may be similar to the maximum depth of the inclined recess pattern of the first inclined pattern portion.

FIG. 1 is a diagram schematically illustrating a method of manufacturing a mold substrate for a diffraction lattice light guide plate according to an exemplary embodiment of the present invention. Particularly, FIG. 1 illustrates the case where a support having an inclined surface is provided within a faraday cage, and then a substrate is positioned on the inclined surface and the substrate is patterned by using plasma etching. As illustrated in FIG. 1, an upper portion and a lower portion of the inclined surface of the support have a high etch speed, and a center portion of the inclined surface has a relatively low etch speed.

According to the exemplary embodiment of the present invention, the support includes two inclined surfaces, and each of the lower surfaces of the inclined surfaces may be positioned in a high etching region of the faraday cage. Particularly, when the two high etching regions within the faraday cage are provided to face each other, two mold substrates for a diffraction lattice light guide plate may be simultaneously manufactured by using the supports including the two inclined surfaces.

FIG. 2 is a diagram schematically illustrating a method of manufacturing a mold substrate for a diffraction lattice light guide plate according to an exemplary embodiment of the present invention. Particularly, FIG. 2 illustrates simultaneously manufacturing two mold substrates for a diffraction lattice light guide plate by providing a support having two inclined surfaces inside a faraday cage, positioning a substrate provided with a mask on the inclined surface of the support, and then performing one etching process by using plasma etching.

According to FIG. 2, a region patterned in a region having a small width by the mask is a second inclined pattern portion, and an etching region is narrow, so that the second inclined pattern portion may be implemented with little depth gradient. Further, a region patterned in a region having a large width by the mask is a second inclined pattern portion, and an etching region is wide, so that the second inclined pattern portion may be implemented with a large depth gradient.

According to the exemplary embodiment of the present invention, the second inclined pattern portion may be the region corresponding to a region of a diffraction lattice light guide plate, into which light is incident. Further, the first inclined pattern portion may be the region corresponding to a region of a diffraction lattice light guide plate, from which light is extracted.

FIG. 3 is a diagram illustrating an example of a diffraction lattice light guide plate manufactured according to the manufacturing method according to the exemplary embodiment of the present invention. Particularly, FIG. 3 illustrates a diffraction lattice light guide plate manufactured according to the mold for the diffraction lattice light guide plate, and illustrates the case where light is incident to the region corresponding to a first inclined recess portion pattern of the diffraction lattice light guide plate and then light is extracted to a region corresponding to a second inclined recess portion pattern to provide a user with display information. In the region corresponding to the second inclined recess portion pattern, an inclined pattern structure has a height gradient, so that light may be uniformly extracted according to a position.

An exemplary embodiment of the present invention provides a method of manufacturing a diffraction lattice light guide plate, the method comprising: preparing a mold substrate for a diffraction lattice light guide plate manufactured by the method of manufacturing the mold substrate for the diffraction lattice light guide plate manufactured by the method of manufacturing the mold substrate for the diffraction lattice light guide plate; applying a resin composition on the mold substrate for the diffraction lattice light guide plate; providing a transparent substrate on a surface opposite surface to a surface provided with a diffraction lattice pattern; forming a diffraction lattice pattern by hardening the resin composition; and separating the mold substrate for the diffraction lattice light guide plate and the diffraction pattern and forming a diffraction lattice light guide plate.

As long as a resin composition is generally used in the art, the resin composition may be used without a limit. Further, the applying of the resin composition may be performed by a coating method, such as spin coating, dip coating, and drop casting, generally used in the art.

A general method of forming a pattern layer may be applied to the method of manufacturing the diffraction lattice light guide plate, except for using the mold substrate for the diffraction lattice light guide plate.

The diffraction lattice light guide plate may be directly used as a diffraction lattice light guide plate. Further, a final product may also be manufactured by a method of duplicating the diffraction lattice light guide plate by using the diffraction lattice light guide plate as an intermediate mold. Particularly, when a diffraction lattice light guide plate is manufactured after a mold for a diffraction lattice light guide plate is manufactured by using the manufactured diffraction lattice light guide plate as an intermediate mold, a diffraction lattice light guide plate, in which an inclination of a lattice pattern of the diffraction lattice light guide plate used as the intermediate mold is reversed, may be obtained. Further, when a diffraction lattice light guide plate is manufactured after a mold for a diffraction lattice light guide plate is manufactured by using a diffraction lattice light guide plate, in which an inclination of a lattice pattern is reversed, as an intermediate mold, it is possible to implement a lattice pattern in the same direction as that of the first diffraction lattice light guide plate.

EXAMPLE

Hereinafter, the present invention will be described in detail based on the Example described herein. However, the Example according to the present invention may be modified into other various forms, and it is not construed that the scope of the present invention is limited to Examples described below. Examples of the present specification are provided for more completely explaining the present invention to those skilled in the art.

FIG. 4 is a diagram schematically illustrating an operation of checking high etching areas of faraday cages according to the Example and the Comparative Example.

Particularly, sheet resistance of a mesh portion of a faraday cage according to the Example was measured as 0.5605 Ω/sg and sheet resistance of a mesh portion of a faraday cage according to the Comparative Example was measured as 0.23 Ω/sg. Particularly, conditions and sheet resistance results of the measurement of the sheet resistance of the mesh portions of the faraday cages according to the Example and the Comparative Example are represented in Table 1 below.

TABLE 1

|  | Example | Comparative Example |
|---|---|---|
| V (V) | 0.2 | 0.2 |
| I (A) | 0.223 | 0.54 |
| R (Ω) | 0.8969 | 0.37 |
| Rs (Ω/sq) | 0.5605 | 0.23 |

FIG. 5 is a diagram illustrating high etching areas of the faraday cages according to the Comparative Example and the Example. Particularly, FIG. 5 represents high etching areas of the faraday cages formed by providing the faraday cages according to the Comparative Example and the Example in the ICP-RIE system and then performing flat etching. In FIG. 5, a bright area means a high etching region. In the case of the faraday cage according to the Comparative Example including a mesh portion having a small sheet resistance value, it can be seen that the high etching region is very irregular and is distributed in a wide area. In contrast, in the case of the faraday cage according to the Example including a mesh portion having a sheet resistance value of 0.5 Ω/sg or more, it can be seen that the linear high etching region having a small width is represented.

Further, a support having an inclined surface was provided in a broken-line region of FIG. 5 while a direction of an inclined surface was made to head a left direction of FIG. 5. Further, an etch depth from an upper surface to a lower surface of the inclined surface was measured by providing a glass substrate (substrate for a mold) having a length of 60 mm on the inclined surface of the support and then performing plasma etching.

Particularly, Al was deposited on the glass substrate having a thickness of 0.8 mm to 2 mm with several tens of nm to form an Al layer. Further, a photoresist was spin-coated on the Al layer, the photoresist was developed through UV curing by using a photo mask having a pitch of 405 nm, and then the Al layer was selectively etched to form a mask on the glass substrate. The mask was used as a substrate for a mold. Further, the support having an inclination of 40° was installed within a plasma box, and then the manufactured substrate for the mold formed with the mask was provided on the support. Further, plasma etching was performed by using the ICP-RIE (Oxford Company plasmaLab system100), and as a reactive gas, $O_2$ and $C_4F_8$ were mixed in a ratio of 1:9 and were supplied at a flow speed of 50 sccm. Further, the etching was performed for three minutes with RF power of 150 W, ICP power of 2 KW, and operation pressure of 7 to 10 mTorr as an etching condition.

FIG. 6 is a diagram illustrating etch depths in a location-based vertical direction during taper etching within the faraday cages according to the Example and the Comparative Example. A horizontal axis of FIG. 6 means a distance from one side to the other side of the glass substrate closely positioned to a mesh surface, and a vertical axis represents an etched vertical depth based on a location. According to FIG. 6, the faraday cage according to the Comparative Example represents an irregular etching region, and it can be seen that an etch speed is gradually decreased as the region is farther from the mesh surface like a general faraday cage. In contrast, in the faraday cage according to the Example, sheet resistance of the mesh portion is adjusted to 0.5 Ω/sg or more and a lower portion of the inclined surface of the support is positioned in the high etching region, so that it can be seen that it is possible to implement an etch rate which decreases and then reversely increases from an upper region to a lower region of the inclined surface.

FIGS. 7A and 7B are scanning electron microscope (SEM) images of a taper etching result based on a location according to the Example. Solid-line regions of FIGS. 7A and 7B are for the easy comparison with an etch depth at a position of 5 mm. Particularly, the drawings of FIGS. 7A and 7B represent a graph result according to the Example of FIG. 6. That is, an upper end of the inclined surface of the substrate for the mold is set to a reference point (0), and a cross-section SEM is observed based on a location, which is away from the reference point at an interval of 5 mm. According to the result of FIGS. 7A and 7B, it can be seen that an etch depth gradually decreases and then reversely increases from the upper portion of the inclined surface toward the center portion of the inclined surface. Further, it can be seen that a difference between an etch rate in the upper region of the inclined surface and an etch rate in the lower region of the inclined surface is not large.

It is possible to manufacture a first inclined pattern portion including an inclined recess pattern having a depth gradient and a second inclined pattern portion having little depth difference by providing the mask on the substrate for the mold by using a tendency of the etch rate at the time of the taper etching according to the Example.

FIG. 8 is a diagram illustrating an example of forming the first inclined pattern portion and the second inclined pattern portion by using the mask during the taper etching according to the Example. Further, FIG. 8 illustrates a graph of an etch depth based on a location of the substrate for the mold and is illustrated so that an etch depth in an opening surface of the mask is recognized. In FIG. 8, an opening portion in a narrow region represents a region, in which the second inclined pattern portion is formed, and an opening portion in a wide region represents a region, in which the first inclined pattern portion is formed.

As can be seen through the Example, the present invention may uniformly form the high etching region within the faraday cage by adjusting a sheet resistance value of the mesh portion. Further, the lower region of the inclined surface of the support is located in the high etching region, so that there is an advantage in that it is possible to simultaneously manufacture the first inclined pattern portion including the inclined recess pattern having a depth gradient and the second inclined pattern portion having little depth deviation.

The invention claimed is:

1. A method of manufacturing a mold substrate for a diffraction lattice light guide plate, the method comprising:
preparing a faraday cage with a mesh having a sheet resistance of 0.5 Ω/sq or more provided on an upper surface of the faraday cage;
providing a sample substrate on a bottom surface of the faraday cage and carrying out flat plasma etching of the sample substrate;
designating a high etching region inside the faraday cage by examining the sample substrate after etching;
preparing a support having an inclined surface and positioning a base of the inclined surface in the high etching region of the faraday cage to align the support;
providing a substrate for a mold on the inclined surface of the support; and
plasma etching the substrate to simultaneously form a first inclined pattern portion at one side of the substrate and a second inclined pattern portion at the other side of the substrate,
wherein an etch rate of the plasma etching decreases and then reversely increases from an upper region to a lower region of the substrate on the inclined surface of the support,
wherein the first inclined pattern portion includes a first inclined recess pattern having a depth gradient, and
wherein the second inclined pattern portion includes a second inclined recess pattern having a depth difference of 0 nm to 50 nm.

2. The method of claim 1, wherein a depth of the second inclined recess pattern is 70% to 130% of a maximum depth of the first inclined recess pattern.

3. The method of claim 1, wherein a difference between an etch speed at a highest point of the substrate on the inclined surface of the support and an etch speed at a lowest point of the substrate on the inclined surface of the support is 30% or less.

4. The method of claim 1, wherein the mesh portion is a metal mesh having a fluorocarbon radical adsorbed thereon.

5. The method of claim 1, wherein the high etching region is linearly represented on the sample substrate.

6. The method of claim 1, further comprising:
providing a mask including an opening pattern portion on the substrate for the mold.

7. The method of claim 1, wherein a difference between a minimum depth and a maximum depth of the first inclined recess pattern is 100 nm or more and 200 nm or less.

8. The method of claim 1, wherein the first inclined pattern portion is formed in the region where the etch rate decreases or the region where the etch rate reversely increases.

9. The method of claim 1, wherein an etch direction during patterning is perpendicular to a lower surface of the faraday cage.

10. The method of claim 1, wherein an angle of inclination of the support is 35° or more and 45° or less.

11. The method of claim 1, wherein the support includes two inclined surfaces, and the base of each of the two inclined surfaces is positioned in a high etching region of the faraday cage.

12. A method of manufacturing a diffraction lattice light guide plate, the method comprising:
preparing a mold substrate for a diffraction lattice light guide plate according to the method of claim 1;
applying a resin composition on the mold substrate for the diffraction lattice light guide plate;
forming a diffraction lattice pattern by hardening the resin composition;
providing a transparent substrate on a surface opposite to a surface provided with a diffraction lattice pattern; and separating the mold substrate to form the diffraction lattice light guide plate.

\* \* \* \* \*